(12) United States Patent
Lee et al.

(10) Patent No.: US 11,677,025 B2
(45) Date of Patent: *Jun. 13, 2023

(54) ELECTRONIC DEVICE INCLUDING FERROELECTRIC LAYER (71) Applicant: Samsung Electronics Co., Ltd., Suwon-si (KR)

(72) Inventors: Yunseong Lee, Busan (KR); Jinseong Heo, Seoul (KR); Sangwook Kim, Seongnam-si (KR); Sanghyun Jo, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/513,050

(22) Filed: Oct. 28, 2021

(65) Prior Publication Data
US 2022/0052202 A1 Feb. 17, 2022

Related U.S. Application Data (63) Continuation of application No. 16/682,380, filed on Nov. 13, 2019, now Pat. No. 11,349,026.

(30) Foreign Application Priority Data

Dec. 4, 2018 (KR) .................. 10-2018-0154694

(51) Int. Cl.
*H01L 29/78* (2006.01)
*H01L 29/51* (2006.01)
(Continued)

(52) U.S. Cl.
CPC ...... *H01L 29/78391* (2014.09); *H01L 21/022* (2013.01); *H01L 21/0228* (2013.01);
(Continued)

(58) Field of Classification Search
CPC ......... H01L 21/02181; H01L 21/02189; H01L 29/78391; H01L 29/0847; H01L 29/42364;
(Continued)

(56) References Cited

U.S. PATENT DOCUMENTS 7,393,736 B2    7/2008 Ahn et al.
11,349,026 B2 * 5/2022 Lee .................. H01L 21/022
(Continued)

FOREIGN PATENT DOCUMENTS

JP    2015220445 A    12/2015
KR    20060093869 A    8/2006
KR    20140003189 A    1/2014

OTHER PUBLICATIONS

Notice of Allowance dated Jan. 26, 2022, issued in corresponding U.S. Appl. No. 16/682,380.
(Continued)

*Primary Examiner* — Jose R Diaz
(74) *Attorney, Agent, or Firm* — Harness, Dickey & Pierce, P.L.C.

(57) ABSTRACT

An electronic device includes a ferroelectric layer arranged on a channel region and a gate electrode arranged on the ferroelectric layer. The ferroelectric layer includes a plurality of first oxide monolayers and a second oxide monolayers that is arranged between the substrate and the gate electrode and include a material different from a material of the first oxide monolayers. The first oxide monolayers include oxide monolayers that are alternately formed and include materials different from one another.

19 Claims, 6 Drawing Sheets (51) Int. Cl.

| | | |
|---|---|---|
| *H01L 29/423* | (2006.01) | |
| *H01L 21/02* | (2006.01) | |
| *H01L 29/66* | (2006.01) | |
| *H01L 29/08* | (2006.01) | |
| *H01L 21/28* | (2006.01) | |
| *H10B 51/30* | (2023.01) | |
| *H01L 27/1159* | (2017.01) | |

(52) U.S. Cl.
CPC .... *H01L 21/02175* (2013.01); *H01L 29/0847* (2013.01); *H01L 29/40111* (2019.08); *H01L 29/42364* (2013.01); *H01L 29/513* (2013.01); *H01L 29/516* (2013.01); *H01L 29/517* (2013.01); *H01L 29/6684* (2013.01); *H01L 21/02181* (2013.01); *H01L 21/02189* (2013.01); *H01L 27/1159* (2013.01)

(58) Field of Classification Search
CPC . H01L 29/513; H01L 29/517; H01L 27/1159; H01L 29/516; H01L 29/40111; H01L 21/02175
See application file for complete search history.

(56) References Cited

U.S. PATENT DOCUMENTS

| | | |
|---|---|---|
| 2004/0129987 A1 | 7/2004 | Uchiyama et al. |
| 2017/0365719 A1 | 12/2017 | Chen et al. |
| 2018/0166453 A1 | 6/2018 | Muller |
| 2018/0240804 A1 | 8/2018 | Yoo |
| 2020/0194591 A1 | 6/2020 | Kim et al. |

OTHER PUBLICATIONS

J.H. Ahn and S. Kwon, 'Sub-0.5 nm Equivalent Oxide Thickness Scaling for Si-Doped $Zr_{1-x}Hf_xO_2$ Thin Film without Using Noble Metal Electrode' *Applied Materials & Interfaces*, vol. 7, 2015, pp. 15587-15592.

Chia-Chi Fan et al., 'Energy-Efficient $HfAlO_x$NCFET: Using Gate Strain and Defect Passivation to Realize Nearly Hysteresis-Free Sub-25mV/dec Switch with Ultralow Leakage' *IEEE*, 2017.

S. Dünkel et al., 'A FeFET based super-low-power ultra-fast embedded NVM technology for 22nm FDSOI and beyond' *IEEE*, 2017.

* cited by examiner

ELECTRONIC DEVICE INCLUDING FERROELECTRIC LAYER

CROSS-REFERENCE TO RELATED APPLICATION

This application is a continuation of U.S. application Ser. No. 16/682,380, filed Nov. 13, 2019, which claims the benefit of Korean Patent Application No. 10-2018-0154694, filed on Dec. 4, 2018, in the Korean Intellectual Property Office, the disclosure of each which is incorporated herein in its entirety by reference.

BACKGROUND

1. Field

The present disclosure relates to electronic devices including a ferroelectric layer having improved current leakage characteristics.

2. Description of Related Art

A silicon-based electronic device including a ferroelectric layer of the related art has a limitation in the improvement of an operational characteristic and scale down. For example, when an operation voltage and a current characteristic of a silicon-based logic transistor are measured, it is known that a subthreshold swing SS is limited to about 60 mV/dec. This indicates that an operational voltage of the logic transistor may not be reduced to about 0.8 V or less as the size of the logic transistor is reduced. Accordingly, the power density may be increased, and thus, there is a limit in scaling down of the logic transistor.

Also, due to a small thickness of the ferroelectric layer, a current leakage may occur. Therefore, there is a need to develop an electronic device that may have an improved operational characteristic, such as the subthreshold swing SS, may easily achieve a scale down, and may increase control efficiency.

SUMMARY

Provided are electronic devices including a ferroelectric layer having improved current leakage characteristics.

Additional aspects will be set forth in part in the description which follows and, in part, will be apparent from the description, or may be learned by practice of the presented embodiments.

According to an aspect of an embodiment, an electronic device includes a substrate; a source structure, a drain structure, and a channel structure on the substrate, the channel structure between the source structure and the drain structure; a ferroelectric layer on the channel structure; and a gate electrode on the ferroelectric layer. The ferroelectric layer may include a plurality of first oxide monolayers and second oxide monolayer between the substrate and the gate electrode. A material of the second oxide monolayer may be different than a material of the plurality of first oxide monolayers.

In some embodiments, the ferroelectric layer may have a thickness in a range from about 1.5 nm to about 10 nm.

In some embodiments, the plurality of first oxide monolayers may include a HfO layer and a ZrO layer.

In some embodiments, the plurality of first oxide monolayers may include oxide monolayers that are alternately formed and may include materials different from one another.

In some embodiments, the plurality of first oxide monolayers may include HfO layers and ZrO layers that may be alternately formed.

In some embodiments, second oxide monolayer may include one to three layers.

In some embodiments, the material of the second oxide monolayer may have a bandgap greater than a bandgap of the material of the plurality of first oxide monolayers.

In some embodiments, the second oxide monolayer may include Al, Si, Y, Mg, Ca, Gd, Sr, or a combination thereof.

In some embodiments, the electronic device may further include an insulating layer between the substrate and the ferroelectric layer.

In some embodiments, the insulating layer may include an Si oxide, an Al oxide, a Hf oxide, a Zr oxide, or a 2 dimensional (2D) insulator.

In some embodiments, the electronic device may further include a conductive layer between the ferroelectric layer and the insulating layer.

In some embodiments, the electronic device may include a logic device or a memory device.

In some embodiments, the channel structure may be a channel layer on the substrate and may include a semiconductor material different than a material of the substrate, and the source region and the drain region may be a source electrode and a drain electrode connected to respective edges of the channel layer.

In some embodiments, the channel structure may include Si, Ge, SiGe, a Group III-V semiconductor, an oxide semiconductor, a nitride semiconductor, an oxynitride semiconductor, a 2D material, a quantum dot, an organic semiconductor, or a combination thereof.

In some embodiments, the source structure and the drain structure may be a source region and a drain region, respectively, in the substrate. The channel structure may be a channel region in the substrate between the source region and the drain region and may be connected to the source region and the drain region.

According to example embodiments, an electronic device may include a channel structure; a source structure connected to a first end region of the channel structure; a drain structure connected to a second end region of the channel structure that is opposite the first end region, the drain structure being spaced apart from the source structure; a gate electrode spaced apart from the channel structure in a vertical direction, the gate electrode and the channel structure stacked on top of each other; and a ferroelectric layer extending between the gate electrode and the channel structure. The ferroelectric layer may include a plurality of first oxide monolayers, a plurality of second oxide monolayers, and a third oxide monolayer between the channel structure and the gate electrode. A material of the third oxide monolayer may have a greater bandgap than a bandgap of a material of the plurality of first oxide monolayers and a bandgap of a material of the plurality of second oxide monolayers.

In some embodiments, the material of the plurality of first oxide monolayers may include hafnium oxide and the material of the plurality of second oxide monolayers may include zirconia.

In some embodiments, the material of the plurality of first oxide monolayers may be different than the material of the plurality of second oxide monolayers. The plurality of first oxide monolayers and the plurality of second oxide monolayers may be alternately stacked on top of each other. The material of the third oxide monolayer may include Al, Si, Y, Mg, Ca, Gd, Sr, or a combination thereof.

In some embodiments, the electronic device may further include a substrate. The source structure and the drain structure may be a source region and a drain region, respectively, in the substrate. The channel structure may be a channel region in the substrate between the source region and the drain region and connected to the source region and the drain region. The gate electrode may be on the substrate.

In some embodiments, the channel structure may be a channel layer, the source structure may be a source electrode, and the drain structure may be a drain electrode.

BRIEF DESCRIPTION OF THE DRAWINGS

These and/or other aspects will become apparent and more readily appreciated from the following description of non-limiting embodiments, taken in conjunction with the accompanying drawings in which.

DETAILED DESCRIPTION

Reference will now be made in detail to embodiments, examples of which are illustrated in the accompanying drawings. In the drawings, thicknesses of layers or regions are exaggerated for clarity of the specification. The present embodiments may have different forms and should not be construed as being limited to the descriptions set forth herein.

It will be understood that when an element is referred to as being "on" or "above" another element, the element may be in direct contact with the other element or other intervening elements may be present.

In the following embodiments, the singular forms include the plural forms unless the context clearly indicates otherwise. It should be understood that, when a part "comprises" or "includes" an element in the specification, unless otherwise defined, it is not excluding other elements but may further include other elements.

The use of the term "the" and an instructional term similar to the "the" may be applied to both singular forms and the plural forms.

With respect to operations that constitute a method, the operations may be performed in any appropriate sequence unless the sequence of operations is clearly described or unless the context clearly indicates otherwise. The operations may not necessarily be performed in the order of sequence. All examples or example terms (for example, etc.) are simply used to explain in detail the technical scope of the disclosure, and thus, the scope of the disclosure is not limited by the examples or the example terms as long as it is not defined by the claims.

Figure 1:
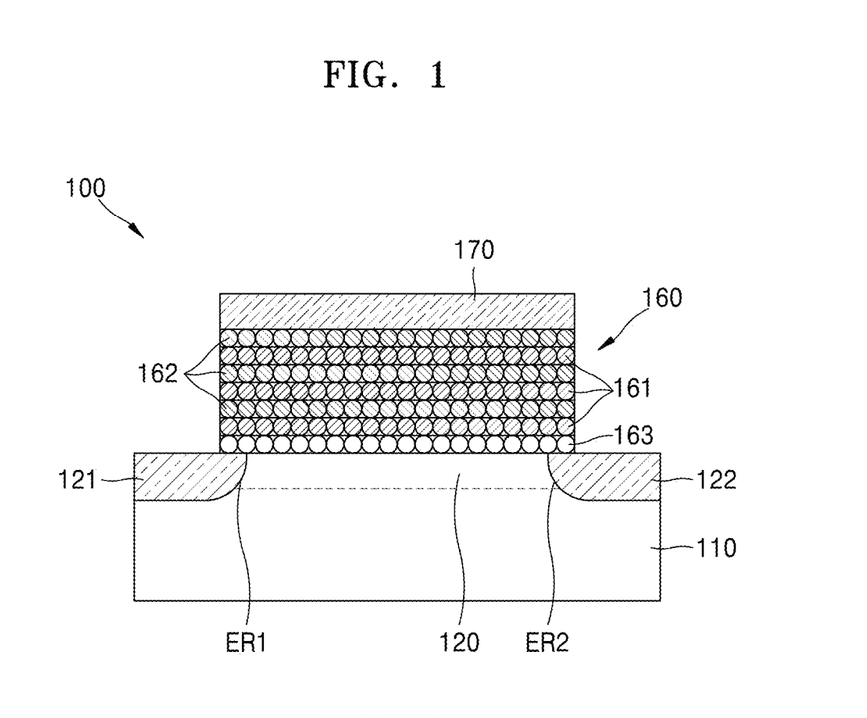
FIG. 1 is a schematic cross-sectional view of an electronic device according to an embodiment.

FIG. 1 is a schematic cross-sectional view of an electronic device 100 according to an embodiment.

Referring to FIG. 1, the electronic device 100 includes a substrate 110 including a source region 121 (also referred to as a source structure) and a drain region 122 (also referred to as a drain structure) that are separated from each other on a surface of the substrate 110. A ferroelectric layer 160 and a gate electrode 170 may be sequentially stacked on the substrate 110 between the source region 121 and the drain region 122. A region on the substrate 110 between the source region 121 and the drain region 122 may be a channel region 120 (also referred to as a channel structure). The ferroelectric layer 160 and the gate electrode 170 may be referred to as a gate stack.

The source region 121 may be electrically connected to a first end region ER1 (e.g., side) of the channel region 120, and the drain region 122 may be electrically connected to a second end region ER2 (e.g., the other side of the channel region 120). The source region 121 and the drain region 122 may be regions doped with a dopant having a polarity different from that of the substrate 110. The substrate 110 may include a semiconductor, such as Si, Ge, SiGe, a Group III-V semiconductor, an organic semiconductor, an oxide semiconductor, a nitride semiconductor, an oxynitride semiconductor, or a combination thereof. The oxide semiconductor may include, for example, InGaZnO, etc. Materials of the substrate 110 are not limited to the materials described above, and may be variously changed. Meanwhile, as described below, the channel region 120 may be formed as another material layer from the substrate 110.

The ferroelectric layer 160 may be formed such that, after forming an amorphous ferroelectric film by repeatedly depositing a monolayer including a ferroelectric material for a few tens of cycles (e.g., 10 to 90, 30 to 70) using an atomic layer deposition (ALD) method, the amorphous ferroelectric film is crystalized through an annealing process.

The ferroelectric layer 160 may include a plurality of first oxide monolayers 161, a plurality of second oxide monolayers 162, and a third oxide monolayer 163. Each of the first oxide monolayers 161, each of the second oxide monolayers 162, and the third oxide monolayer 163 may be an oxide monolayer formed by using an ALD method. Each of the first oxide monolayers 161, each of the second oxide monolayers 162 and the third oxide monolayer 163 may be formed by injecting a purge gas after injecting a corresponding source gas, and re-injecting a purge gas after injecting a reaction gas. In some embodiments, the resultant product may further be annealed.

The first oxide monolayers 161, the second oxide monolayers 162, and the third oxide monolayer 163 may be material layers different from each other.

The first oxide monolayers 161 and the second oxide monolayers 162 may be alternately formed. However, the present embodiment is not limited thereto. For example, a ratio of the number of the first oxide monolayers 161 and the number of the second oxide monolayers 162 may be 1:1 or a different ratio than 1:1. For example, when the ratio of the number of the first oxide monolayers 161 and the number of the second oxide monolayers 162 is 2:1, the second oxide monolayer 162 is formed once after forming the first oxide monolayer 161 twice. Afterwards, this process is repeated.

The first oxide monolayer 161 and the second oxide monolayer 162 may include hafnium oxide and zirconia, respectively. However, the present embodiment is not limited thereto. The first oxide monolayer 161 and the second oxide monolayer 162 may include the same material. That is, both the first oxide monolayer 161 and the second oxide monolayer 162 may include hafnium oxide or zirconia.

The third oxide monolayer 163 may include a material having a bandgap greater than that of the first oxide monolayer 161 and the second oxide monolayer 162. That is, the third oxide monolayer 163 may include a material having a bandgap greater than that of hafnium oxide or zirconia. The third oxide monolayer 163 that includes a material having a bandgap greater than that of the first oxide monolayer 161 and the second oxide monolayer 162 may improve a current leakage characteristic according to an application of a voltage. The third oxide monolayer 163 may be an oxide layer including Al, Si, Y, Mg, Ca, Gd, Sr, or a combination thereof. The third oxide monolayer 163 may be referred to as a current blocking layer.

The first oxide monolayers 161, the second oxide monolayers 162, and the third oxide monolayer 163 respectively may have a thickness of approximately 0.1 nm. The ferroelectric layer 160 may have a thickness in a range from about 1.5 nm to about 10 nm. When the ferroelectric layer 160 has a thickness less than 1.5 nm, a current breakdown may occur easily, and accordingly, a current leakage characteristic may be reduced and a current may tunnel through the ferroelectric layer 160. When the ferroelectric layer 160 has a thickness greater than 10 nm, a hysteresis characteristic that shows a ferroelectric characteristic may be degraded.

Figure 8A:
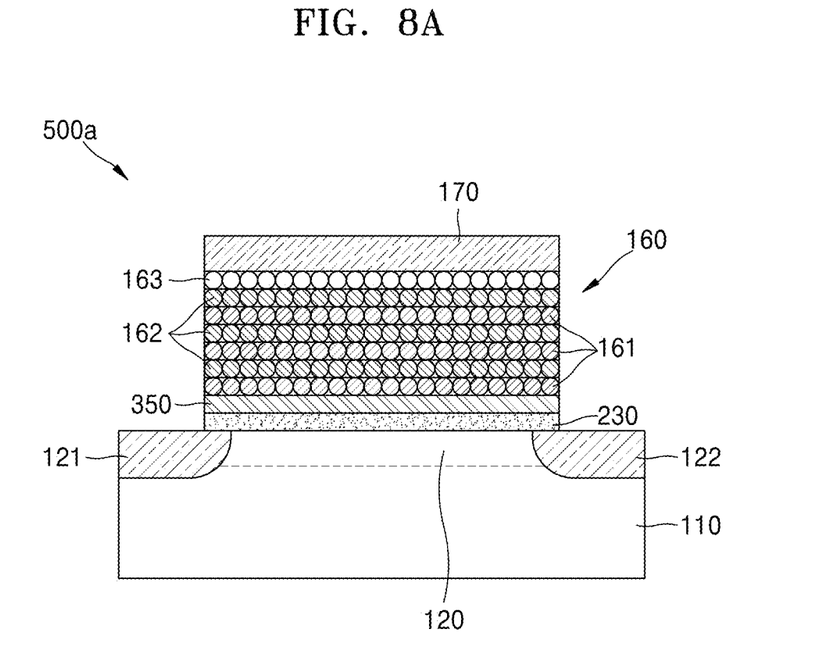
FIG. 8A is a schematic cross-sectional view of an electronic device according to another embodiment.
Figure 8B:
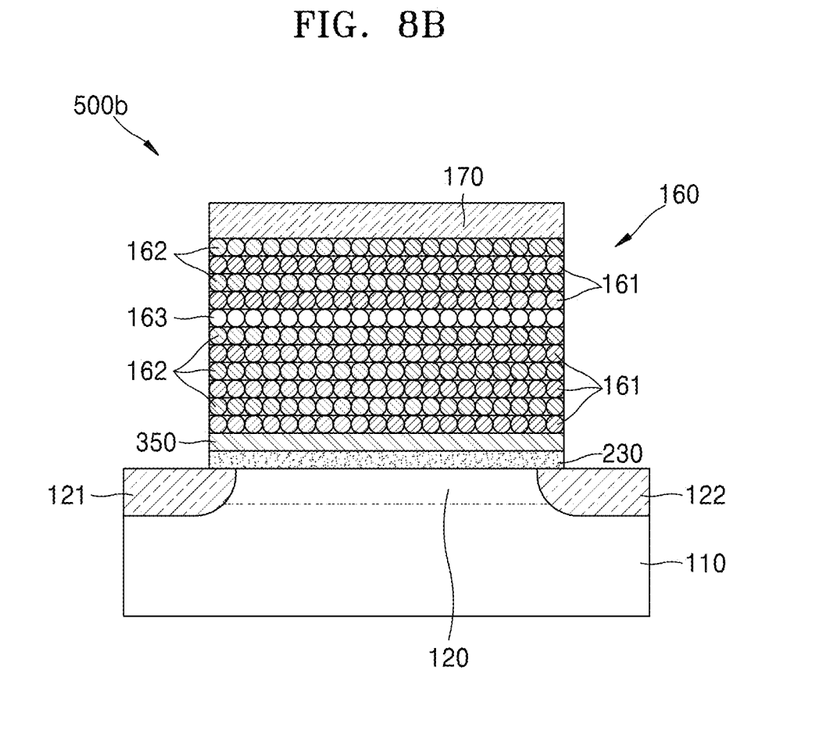
FIG. 8B is a schematic cross-sectional view of an electronic device according to another embodiment.

As depicted in FIG. 1, the third oxide monolayer 163 may be formed on a surface of the substrate 110. However, the present embodiment is not limited thereto. For example, the third oxide monolayer 163 may be formed to contact the gate electrode 170, as depicted in FIG. 8A. Also, the third oxide monolayer 163 may be formed between the first oxide monolayer 161 and the second oxide monolayer 162, as depicted in FIG. 8B.

The third oxide monolayer 163 may include approximately one layer through three layers. When the third oxide monolayer 163 includes plural layers, the plural layers may be continuously formed or may be separated from each other.

The gate electrode 170 may contact the ferroelectric layer 160. The gate electrode 170 may include a general metal.

The electronic device 100 according to the present embodiment may be a logic transistor. In the electronic device 100, the third oxide monolayer 163 interrupts the flow of a current between the gate electrode 170 and the substrate 110, and thus, the current leakage characteristic of the electronic device 100 is improved.

The electronic device 100 according to the present embodiment includes the ferroelectric layer 160, and thus, a subthreshold swing value may be reduced.

Figure 2:
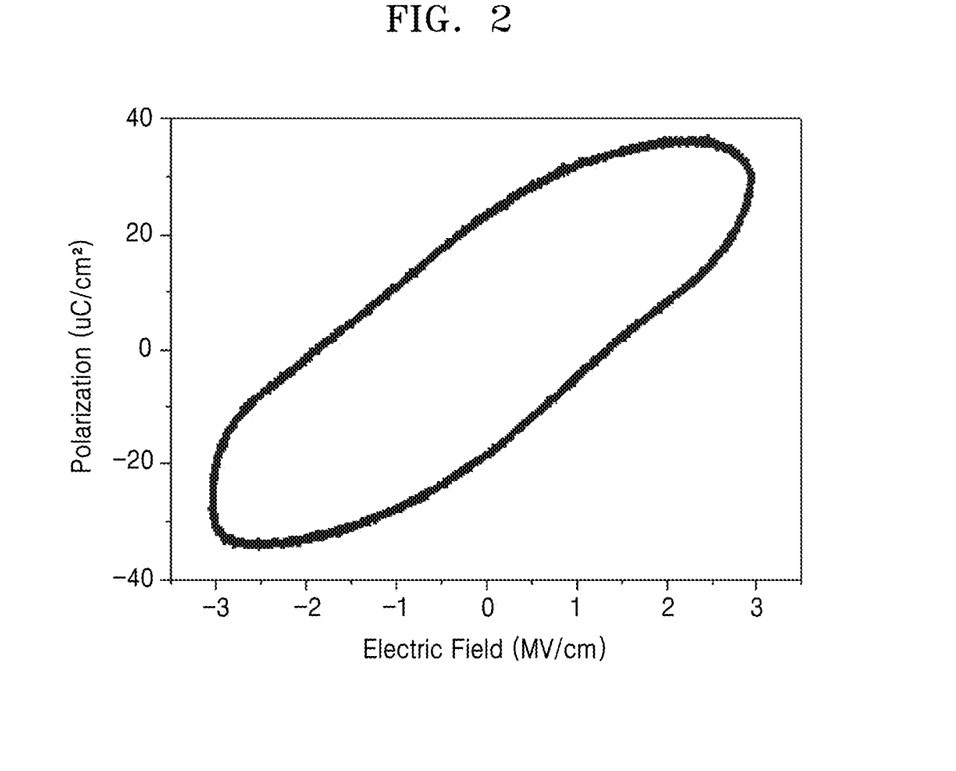
FIG. 2 is a graph showing hysteresis characteristics of a silicon-based logic transistor of the related art.
Figure 3:
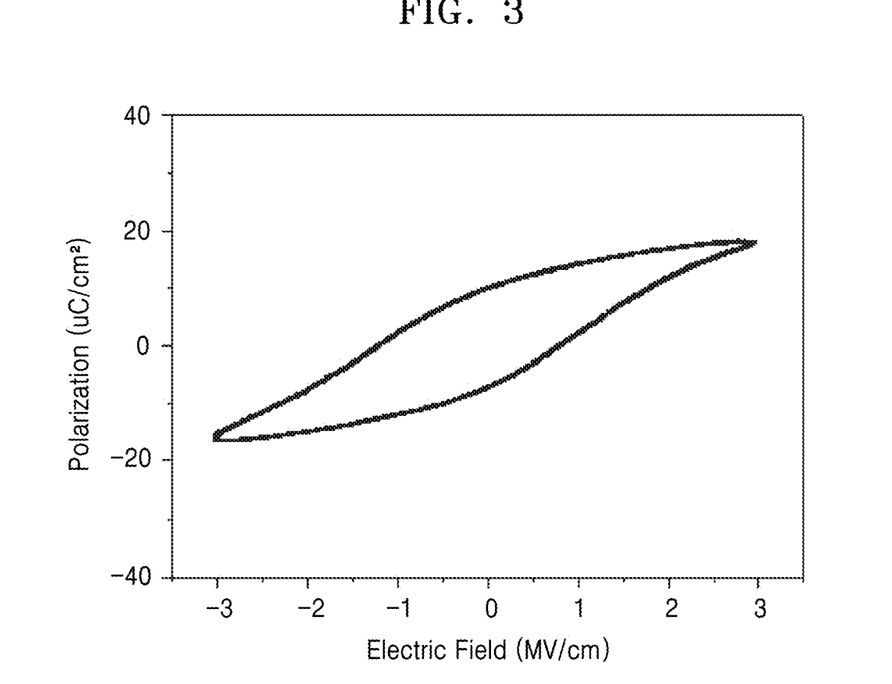
FIG. 3 is a graph showing a hysteresis characteristic of a logic transistor according to an embodiment.

FIG. 2 is a graph showing a hysteresis characteristic of a silicon-based logic transistor of the related art. FIG. 3 is a graph showing a hysteresis characteristic of a logic transistor according to an embodiment. The silicon-based logic transistor of the related art includes a HfZrO ferroelectric layer 160 having a thickness of 5 nm. In the logic transistor according to the present embodiment (see FIG. 3), a HfO monolayer and a ZrO monolayer are alternately repeated 25 times, and a single layer of aluminum oxide is formed between the substrate 110 and the first oxide monolayer 161.

Referring to FIGS. 2 and 3, when compared to the silicon-based logic transistor of the related art, FIG. 3 shows the ferroelectric hysteresis characteristic of the logic transistor logic transistor according to the present embodiment is improved, and accordingly, the current leakage characteristic is improved. Accordingly, the breakdown voltage of the logic transistor according to the present embodiment is increased.

In the electronic device 100 according to the present embodiment, a current that flows through the ferroelectric layer 160 is blocked by the third oxide monolayer 163, and thus, the current leakage in the ferroelectric layer 160 is limited and/or prevented. In particular, since the third oxide monolayer 163 has a layer structure, the current movement may be efficiently blocked.

Also, since the third oxide monolayer 163 has a thickness of 0.3 nm or less, a thickness of the electronic device 100 may be reduced. Accordingly, the scale down of the electronic device 100 may be readily realized.

Figure 4:
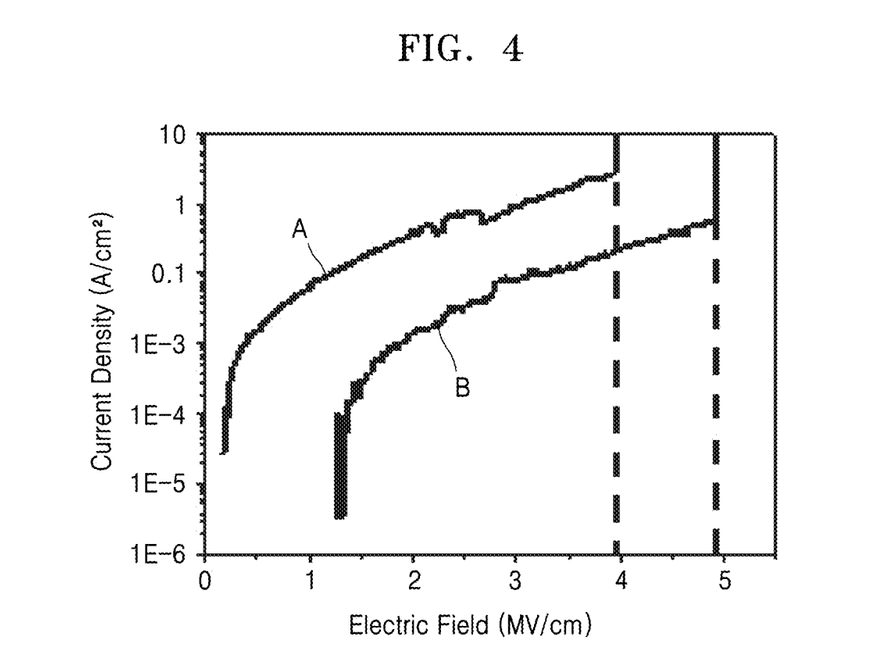
FIG. 4 is a graph showing current leakage characteristics of a logic transistor according to an embodiment.

FIG. 4 is a graph showing a current leakage characteristic of a logic transistor according to an embodiment. In FIG. 4, a curve A indicates a current density vs. electric field characteristic of the silicon-based logic transistor of the related art, and a curve B indicates a current density vs. electric field characteristic of the logic transistor according to the present embodiment. The silicon-based logic transistor of the related art and the logic transistor according to the present embodiment have structures substantially identical transistors described with reference to FIGS. 2 and 3, and thus, the detailed descriptions thereof will be omitted.

Referring to FIG. 4, the breakdown voltage of the logic transistor according to the present embodiment is increased about 1 MV/cm with respect to the breakdown voltage of the silicon-based logic transistor of the related art. That is, the logic transistor according to the present embodiment shows an improved current leakage characteristic when compared to that of the silicon-based logic transistor of the related art.

Figure 5:
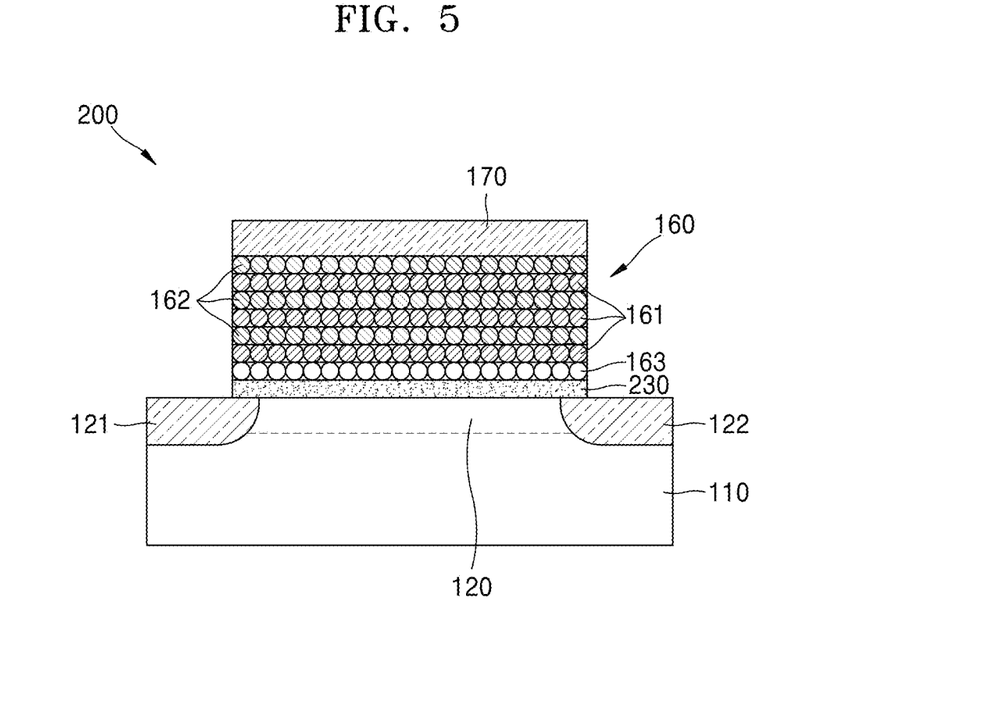
FIG. 5 is a cross-sectional view of an electronic device according to another embodiment.

FIG. 5 is a cross-sectional view of an electronic device 200 according to another embodiment. Like reference numerals are used to indicate elements substantially identical to the elements of the electronic device 100 of FIG. 1, and the descriptions thereof will be omitted.

The electronic device 200 includes a substrate 110 including a source region 121 and a drain region 122 that are separated from each other by a desired (and/or alternatively predetermined) gap on a surface of the substrate 110. An insulating layer 230, a ferroelectric layer 160, and a gate electrode 170 are sequentially stacked between the source region 121 and the drain region 122 on the substrate 110. A region of the substrate 110 between the source region 121 and the drain region 122 may be a channel region 120. That is, the insulating layer 230, the ferroelectric layer 160, and the gate electrode 170 may be arranged on the channel region 120. The insulating layer 230, the ferroelectric layer 160, and the gate electrode 170 may be referred to as a gate stack.

The substrate 110 may include Si, Ge, SiGe, a Group III-V semiconductor, an organic semiconductor, an oxide semiconductor, a nitride semiconductor, or an oxynitride semiconductor. Materials of the substrate 110 are not limited to the materials described above, and may include various materials. Meanwhile, as described below, the channel region 120 may be formed as another material layer from the substrate 110.

The insulating layer 230 may include an Si oxide, an Al oxide, a Hf oxide, a Zr oxide, or a two-dimensional (2D) insulator. The 2D insulator may include hexagonal boron nitride. However, materials of the insulating layer 230 are not limited thereto and may include various materials. A thickness of the insulating layer 230 may be, for example, approximately 5 nm or less. However, the thickness of the insulating layer 230 is not limited thereto, that is, the thickness of the insulating layer 230 may be greater than 5 nm. The insulating layer 230 may repress or prevent an electrical leakage.

The ferroelectric layer 160 may be formed such that, after forming an amorphous ferroelectric film by repeatedly depositing a desired (and/or alternatively predetermined) ferroelectric material using an ALD method, the amorphous ferroelectric film is crystalized through an annealing process.

The ferroelectric layer 160 may be formed such that, after forming an amorphous ferroelectric film by repeatedly depositing a monolayer including a ferroelectric material for a few tens of cycles (e.g., 10 to 90, 30 to 70) using an ALD method, the amorphous ferroelectric film is crystalized through an annealing process.

The ferroelectric layer 160 may include a plurality of first oxide monolayers 161, a plurality of second oxide monolayers 162, and a third oxide monolayer 163. Each of the first oxide monolayers 161, each of the second oxide monolayers 162, and the third oxide monolayer 163 respectively may be an oxide monolayer formed by using an ALD method. Each of the first oxide monolayers 161, each of the second oxide monolayers 162, and the third oxide monolayer 163 respectively may be formed by injecting a purge gas after injecting a corresponding source gas, and re-injecting a purge gas after injecting a reaction gas. In some embodiments, the resultant product may further be annealed.

The first oxide monolayers 161, the second oxide monolayers 162, and the third oxide monolayer 163 may be material layers different from each other. The first oxide monolayer 161 and the second oxide monolayer 162 respectively may include hafnium oxide and zirconia. However, the present embodiment is not limited thereto. The first oxide monolayer 161 and the second oxide monolayer 162 may include the same material. That is, both the first oxide monolayer 161 and the second oxide monolayer 162 may include hafnium oxide or zirconia.

The third oxide monolayer 163 may include a material having a bandgap greater than that of the first oxide monolayer 161 and the second oxide monolayer 162. The third oxide monolayer 163 that includes a material having a large bandgap may improve a current leakage characteristic according to an application of voltage. The third oxide monolayer 163 may be an oxide layer including one of Al, Si, Y, Mg, Ca, Gd, and Sr.

The first oxide monolayers 161, the second oxide monolayers 162, and the third oxide monolayer 163 respectively may have a thickness of approximately 0.1 nm. The ferroelectric layer 160 may have a thickness in a range from about 1.5 nm to about 10 nm. When the ferroelectric layer 160 has a thickness less than 1.5 nm, the breakdown of a current may be easily occurred, and accordingly, a current leakage characteristic is reduced and a current may tunnel through the ferroelectric layer 160. When the ferroelectric layer 160 has a thickness greater than 10 nm, a hysteresis characteristic that shows a ferroelectric characteristic may be degraded.

As depicted in FIG. 5, the third oxide monolayer 163 may be formed on an upper surface of the insulating layer 230. However, the present embodiment is not limited thereto. For example, the third oxide monolayer 163 may be formed to contact the gate electrode 170. Also, the third oxide monolayer 163 may be formed between the first oxide monolayer 161 and the second oxide monolayer 162.

The third oxide monolayer 163 may include one to three layers. When the third oxide monolayer 163 includes a plurality of layers, the plurality of layers may be continuously formed or may be separated from each other.

The gate electrode 170 may contact the ferroelectric layer 160. The gate electrode 170 may include a general metal.

The electronic device 200 according to the present embodiment may be a logic transistor. In the electronic device 200, the third oxide monolayer 163 and the insulating layer 230 interrupt the flow of a current between the gate electrode 170 and the substrate 110, and thus, the current leakage characteristics of the electronic device 200 are improved.

Figure 6:
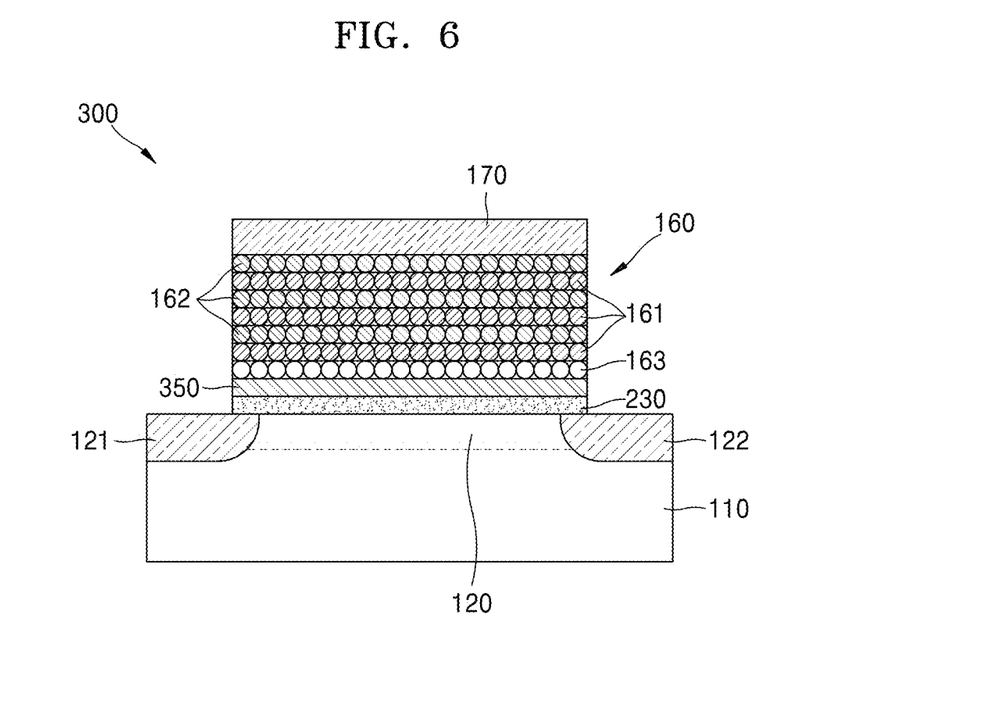
FIG. 6 is a cross-sectional view of an electronic device according to another embodiment.

FIG. 6 is a cross-sectional view of an electronic device 300 according to another embodiment. Like reference numerals are used to indicate elements substantially identical to the elements of the electronic devices 100 and 200 of FIGS. 1 and 5, and the descriptions thereof will be omitted.

The electronic device 300 includes a substrate 110 including a source region 121 and a drain region 122 that are separated from each other by a desired (and/or alternatively predetermined) gap on a surface of the substrate 110. An insulating layer 230, a conductive layer 350, a ferroelectric layer 160, and a gate electrode 170 are sequentially stacked between the source region 121 and the drain region 122 on the substrate 110. A region of the substrate 110 between the source region 121 and the drain region 122 may be a channel region 120. That is, the insulating layer 230, the conductive layer 350, the ferroelectric layer 160, and the gate electrode 170 may be arranged on the channel region 120. The insulating layer 230, the conductive layer 350, the ferroelectric layer 160, and the gate electrode 170 may be referred to as a gate stack.

The substrate 110 may be, for example, a Si substrate, but may include other material, for example, Ge, SiGe, a Group III-V semiconductor, or an organic semiconductor.

The insulating layer 230 may include an Si oxide, an Al oxide, a Hf oxide, a Zr oxide, or a 2D insulator. A thickness of the insulating layer 230 may be, for example, approximately 5 nm or less. However, the thickness of the insulating layer 230 is not limited thereto, that is, the thickness of the insulating layer 230 may be greater than 5 nm. The insulating layer 230 may repress or prevent an electrical leakage.

The conductive layer 350 may include a metal or a metal compound. The conductive layer 350 may be a floating electrode. The insulating layer 230 may insulate the channel region 120 from the conductive layer 350.

The ferroelectric layer 160 may be formed such that, after forming an amorphous ferroelectric film by depositing a desired (and/or alternatively predetermined) ferroelectric material using an ALD method, the amorphous ferroelectric film is crystalized through an annealing process.

The ferroelectric layer 160 may be formed such that, after forming an amorphous ferroelectric film by repeatedly depositing a monolayer including a ferroelectric material for a few tens of cycles (e.g., 10 to 90, 30 to 70) using an ALD method, the amorphous ferroelectric film is crystalized through an annealing process.

The ferroelectric layer 160 may include a plurality of first oxide monolayers 161, a plurality of second oxide monolayers 162, and a third oxide monolayer 163. Each of the first oxide monolayers 161, each of the second oxide monolayers 162, and the third oxide monolayer 163 may be an oxide monolayer formed by using an ALD method. Each of the first oxide monolayers 161, each of the second oxide monolayers 162, and the third oxide monolayer 163 respectively may be formed by injecting a purge gas after injecting a corresponding source gas, and re-injecting a purge gas after injecting a reaction gas. In some embodiments, the resultant product may further be annealed.

The first oxide monolayers 161, the second oxide monolayers 162, and the third oxide monolayer 163 may be material layers different from each other.

The first oxide monolayer 161 and the second oxide monolayer 162 may be alternately formed, but the present embodiment is not limited thereto. For example, a ratio of the number of the first oxide monolayers 161 and the number of the second oxide monolayers 162 may be 1:1 or a different ratio than 1:1. For example, when a ratio of the number of the first oxide monolayers 161 and the number of the second oxide monolayers 162 is 2:1, after forming the first oxide monolayers 161 twice, the second oxide monolayers 162 may be formed once. Afterwards, this process may be repeated.

The first oxide monolayers 161 and the second oxide monolayers 162 respectively may include hafnium oxide and zirconia.

However, the present embodiment is not limited thereto. The first oxide monolayer 161 and the second oxide monolayer 162 may include the same material. That is, both the first oxide monolayer 161 and the second oxide monolayer 162 may include hafnium oxide or zirconia.

The third oxide monolayer 163 may include a material having a bandgap greater than that of the first oxide monolayer 161 and the second oxide monolayer 162. The third oxide monolayer 163 that includes a material having a large bandgap may improve a current leakage characteristic according to an application of a voltage. The third oxide monolayer 163 may be an oxide layer including one of Al, Si, Y, Mg, Ca, Gd, and Sr.

The first oxide monolayers 161, the second oxide monolayers 162, and the third oxide monolayer 163 respectively may have a thickness of approximately 0.1 nm. The ferroelectric layer 160 may have a thickness in a range from about 1.5 nm to about 10 nm. When the ferroelectric layer 160 has a thickness less than 1.5 nm, a current breakdown may be easily occurred, and accordingly, a current leakage characteristic is reduced and a current may tunnel through the ferroelectric layer 160. When the ferroelectric layer 160 has a thickness greater than 10 nm, a hysteresis characteristic that shows a ferroelectric characteristic may be degraded.

As depicted in FIG. 6, the third oxide monolayer 163 may be formed on a surface of the conductive layer 350. However, the present embodiment is not limited thereto. For example, the third oxide monolayer 163 may be formed to contact the gate electrode 170. Also, the third oxide monolayer 163 may be formed between the first oxide monolayer 161 and the second oxide monolayer 162.

The third oxide monolayer 163 may be formed approximately from one layer up to three layers. When the third oxide monolayer 163 includes plural layers, the plural layers may be continuously formed or may be separated from each other.

The gate electrode 170 may contact the ferroelectric layer 160. The gate electrode 170 may include a general metal.

The electronic device 300 according to the present embodiment may be a memory device. For example, the electronic device 300 may be a ferroelectric random access memory.

In the electronic device 300, the third oxide monolayer 163 interrupts the flow of a current between the gate electrode 170 and the conductive layer 350, and thus, the current leakage characteristic of the memory device is improved.

Figure 7:
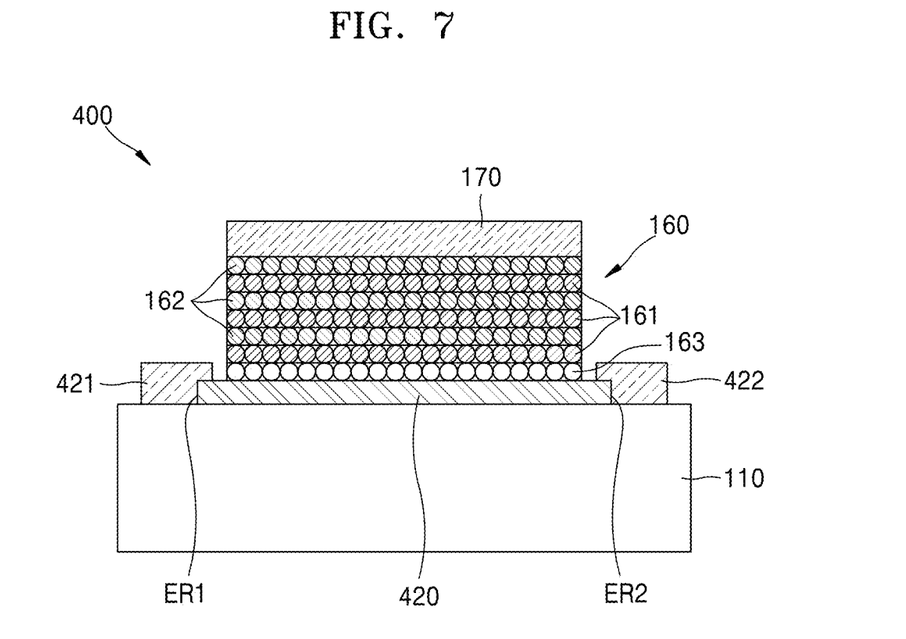
FIG. 7 is a schematic cross-sectional view of an electronic device according to another embodiment.

FIG. 7 is a cross-sectional view of an electronic device 400 according to another embodiment. Like reference numerals are used to indicate elements substantially identical to the elements of the electronic devices described above, and thus, the descriptions thereof will be omitted.

Referring to FIG. 7, the electronic device 400 includes a channel layer 420 on the substrate 110. The channel layer 420 includes a material different from that of the substrate 110. The channel layer 420 may include at least one of, for example, Si, Ge, SiGe, a Group III-V semiconductor, an organic semiconductor, an oxide semiconductor, a nitride semiconductor, an oxynitride semiconductor, a 2D material, a quantum dot, or a combination thereof. The oxide semiconductor may include, for example, InGaZnO. The 2D material may include, for example, transition metal dichalcogenide (TMD), graphene, or $MoS_2$. The quantum dot may include colloidal quantum dot (QD) or a nanocrystal structure.

A source electrode 421 (also referred to as a source structure) and a drain electrode 422 (also referred to as a drain structure) that are electrically connected to different regions of the channel layer 420 (also referred to as a channel structure). The source electrode 421 may be arranged on a first edge of the channel layer 420, and the drain electrode 422 may be arranged on a second edge of the channel layer 420. The source electrode 421 and the drain electrode 422 may include a conductive material, such as a metal, a metal compound, a conductive polymer, etc.

A gate stack may be arranged on the channel layer 420 between the source electrode 421 and the drain electrode 422. The gate stack may be identical or similar to the gate stack of FIG. 1. The gate stack may be modified to the gate stacks of FIGS. 5 and 6.

The electronic device 400 may be a logic transistor. In the electronic device 400, the third oxide monolayer 163 interrupts the flow of a current between the gate electrode 170 and the substrate 110, and thus, the current leakage characteristic of the electronic device 400 is improved.

Figure 9A:
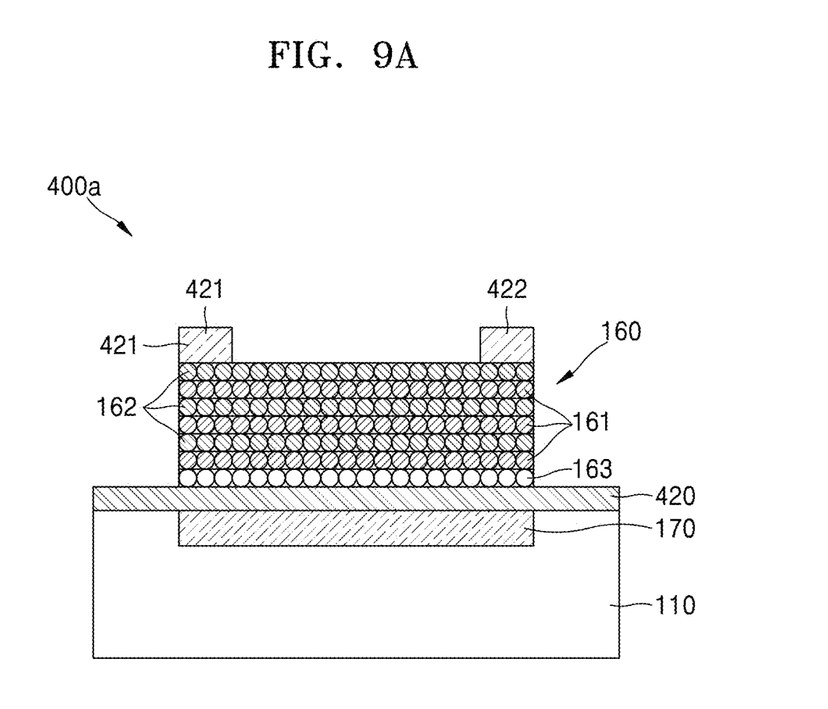
FIG. 9A is a schematic cross-sectional view of an electronic device according to another embodiment.
Figure 9B:
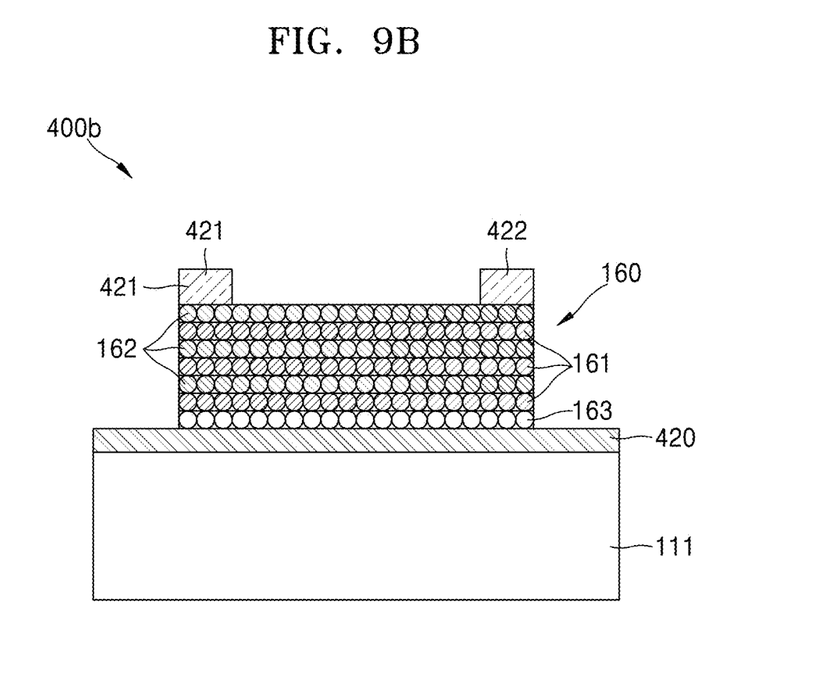
FIG. 9B is a schematic cross-sectional view of an electronic device according to another embodiment.

FIGS. 9A & 9B are cross-sectional views of electronic devices 400a & 400b according to other embodiments. Like reference numerals are used to indicate elements substantially identical to the elements of the electronic devices described above, and thus, the descriptions thereof will be omitted.

Referring to FIGS. 9A & 9B, the electronic device 400a & 400b include a channel layer 420 on the substrate 110 or 111, respectively. The channel layer 420 includes a material different from that of the substrate 110 or 111. The channel layer 420 may include at least one of, for example, Si, Ge, SiGe, a Group III-V semiconductor, an organic semiconductor, an oxide semiconductor, a nitride semiconductor, an oxynitride semiconductor, a 2D material, a quantum dot, or a combination thereof. The oxide semiconductor may include, for example, InGaZnO. The 2D material may include, for example, transition metal dichalcogenide (TMD), graphene, or $MoS_2$. The quantum dot may include colloidal quantum dot (QD) or a nanocrystal structure.

A source electrode 421 (also referred to as a source structure) and a drain electrode 422 (also referred to as a drain structure) may be arranged on the ferroelectric layer 160. The source electrode 421 may be arranged on a first edge of the ferroelectric layer 160, and the drain electrode 422 may be arranged on a second edge of the ferroelectric layer 160. The source electrode 421 and the drain electrode 422 may include a conductive material, such as a metal, a metal compound, a conductive polymer, etc.

Regarding to FIG. 9A, a gate electrode 170 may be arranged under the channel layer 420. Thus, the gate electrode 170 may be arranged between the channel layer 420 and the substrate 110. Regarding to FIG. 9B, the substrate 111 may include conductive material. Thus, the substrate 111 may be the gate electrode of the electronic device 400b.

While one or more embodiments have been described with reference to the figures, it will be understood by those of ordinary skill in the art that various changes in form and details may be made therein without departing from the spirit and scope as defined by the following claims.

What is claimed is:

1. An electronic device comprising:
a substrate;
a source structure, a drain structure, and a channel structure on the substrate,
the channel structure between the source structure and the drain structure, and the source structure and the drain structure being separated from each other on the substrate;
a ferroelectric layer on the channel structure; and
a gate electrode on the ferroelectric layer,
the ferroelectric layer including a plurality of first oxide monolayers and a second oxide monolayer between the substrate and the gate electrode, a material of the second oxide monolayer being different than a material of the plurality of first oxide monolayers,
wherein a thickness ratio of the second oxide monolayer to the ferroelectric layer is between 1% and about 20%,
wherein the second oxide monolayer is between the channel structure and at least one of the plurality of first oxide monolayers,
wherein the plurality of first oxide monolayers include a HfO layer and a ZrO layer.

2. The electronic device of claim 1, wherein the ferroelectric layer has a thickness in a range from about 1.5 nm to about 10 nm.

3. The electronic device of claim 1, wherein the plurality of first oxide monolayers include HfO layers and ZrO layers that are alternately formed, and the HfO layers and the ZrO layers include the HfO layer and the ZrO layer.

4. The electronic device of claim 1, wherein the second oxide monolayer includes one to three layers.

5. The electronic device of claim 1, wherein the material of the second oxide monolayer has a bandgap that is greater than a bandgap of the material of the plurality of first oxide monolayers.

6. The electronic device of claim 1, wherein the second oxide monolayer includes Al, Si, Y, Mg, Ca, Gd, Sr, or a combination thereof.

7. The electronic device of claim 1, further comprising: an insulating layer on the substrate and under the ferroelectric layer.

8. The electronic device of claim 7, wherein the insulating layer includes an Si oxide, an Al oxide, a Hf oxide, a Zr oxide, or a 2D insulator.

9. The electronic device of claim 1, wherein the electronic device includes a logic device or a memory device.

10. The electronic device of claim 1, wherein the channel structure is a channel layer on the substrate that includes a semiconductor material different than a material of the substrate, and
the source structure and the drain structure are a source electrode and a drain electrode respectively connected to respective edges of the channel layer.

11. The electronic device of claim 10, wherein the channel structure includes Si, Ge, SiGe, a Group III-V semiconductor, an oxide semiconductor, a nitride semiconductor, an oxynitride semiconductor, a 2D material, a quantum dot, an organic semiconductor, or a combination thereof.

12. The electronic device of claim 1, wherein
the source structure and the drain structure are a source region and a drain region, respectively, in the substrate,
the channel structure is a channel region in the substrate between the source region and the drain region and connected to the source region and the drain region.

13. An electronic device comprising:
a substrate;
a source structure, a drain structure, and a channel structure on the substrate,
the channel structure between the source structure and the drain structure, and the source structure and the drain structure being separated from each other on the substrate;
a ferroelectric layer on the channel structure;
an insulating layer on the substrate and under the ferroelectric layer;
a conductive layer between the ferroelectric layer and the insulating layer; and
a gate electrode on the ferroelectric layer,
the ferroelectric layer including a plurality of first oxide monolayers and a second oxide monolayer between the substrate and the gate electrode, a material of the second oxide monolayer being different than a material of the plurality of first oxide monolayers, wherein a thickness ratio of the second oxide monolayer to the ferroelectric layer is between 1% and about 20%.

14. An electronic device comprising:
a channel structure;
a source structure connected to a first end region of the channel structure;
a drain structure connected to a second end region of the channel structure that is opposite the first end region, the drain structure being spaced apart from the source structure;
a gate electrode spaced apart from the channel structure in a vertical direction, the gate electrode and the channel structure stacked on top of each other; and
a ferroelectric layer extending between the gate electrode and the channel structure,
the ferroelectric layer including a plurality of first oxide monolayers, a plurality of second oxide monolayers, and a third oxide monolayer between the channel structure and the gate electrode, a material of the third oxide monolayer having a greater bandgap than a bandgap of a material of the plurality of first oxide monolayers and a bandgap of a material of the plurality of second oxide monolayers,
wherein a thickness ratio of the third oxide monolayer to the ferroelectric layer is between 1% and about 20%,
wherein each thickness of a first oxide monolayer in the plurality of first oxide monolayers and a second oxide monolayer in the plurality of second oxide monolayers are about 0.1 nanometers,
wherein a thickness of the third oxide monolayer is about 0.3 nanometer or less.

15. The electronic device of claim 14, wherein the material of the plurality of first oxide monolayers includes hafnium oxide, and the material of the plurality of second oxide monolayers includes zirconia.

16. The electronic device of claim 14, wherein
the material of the plurality of first oxide monolayers is different than the material of the plurality of second oxide monolayers,
the plurality of first oxide monolayers and the plurality of second oxide monolayers are alternately stacked on top of each other, and
the material of the third oxide monolayer includes Al, Si, Y, Mg, Ca, Gd, Sr, or a combination thereof.

17. The electronic device of claim 14, further comprising:
a substrate, wherein
the source structure and the drain structure are a source region and a drain region, respectively, in the substrate,
the channel structure is a channel region in the substrate between the source region and the drain region and connected to the source region and the drain region, and
the gate electrode is on the substrate.

18. The electronic device of claim 14, wherein
the channel structure is a channel layer,
the source structure is a source electrode, and
the drain structure is a drain electrode.

19. The electronic device of claim 14, further comprising:
a conductive layer between the ferroelectric layer and the channel structure.

\* \* \* \* \*